United States Patent
Schreiner et al.

(10) Patent No.: US 6,821,472 B2
(45) Date of Patent: Nov. 23, 2004

(54) METHOD OF LASER MACHINING MATERIALS WITH MINIMAL THERMAL LOADING

(75) Inventors: Alexander F. Schreiner, Sugar Hill, GA (US); Neal Hofmann, Atlanta, GA (US)

(73) Assignee: Siemens Dematic Electronics Assembly Systems, Inc., Norcross, GA (US)

(*) Notice: Subject to any disclaimer, the term of this patent is extended or adjusted under 35 U.S.C. 154(b) by 299 days.

(21) Appl. No.: 10/120,029

(22) Filed: Apr. 10, 2002

(65) Prior Publication Data

US 2003/0193117 A1 Oct. 16, 2003

(51) Int. Cl.[7] .............................................. B23K 26/38
(52) U.S. Cl. .................. 264/400; 264/482; 219/121.67; 219/121.68; 219/121.69; 219/121.71; 219/121.76; 219/121.85
(58) Field of Search ....................... 219/121.67, 121.68, 219/121.69, 121.7, 121.71, 121.76, 121.77, 121.85; 264/400, 482

(56) References Cited

U.S. PATENT DOCUMENTS

| | | | |
|---|---|---|---|
| 3,989,778 A | 11/1976 | Osborne | |
| 4,224,096 A | 9/1980 | Osborne | |
| 4,652,721 A | * 3/1987 | Miller et al. | 219/121.67 |
| 4,918,284 A | 4/1990 | Weisz | |
| 5,521,352 A | 5/1996 | Lawson | |
| 5,578,229 A | 11/1996 | Barnekov et al. | |
| 5,590,854 A | * 1/1997 | Shatz | 244/206 |
| 5,595,791 A | 1/1997 | Baumgart et al. | |
| 5,643,472 A | 7/1997 | Engelberg et al. | |
| 5,874,011 A | 2/1999 | Ehrlich | |
| 5,883,356 A | 3/1999 | Bauer et al. | |
| 5,981,902 A | 11/1999 | Arita et al. | |
| 5,981,903 A | 11/1999 | Baumgart et al. | |
| 6,087,625 A | 7/2000 | Iso | |
| 6,128,199 A | 10/2000 | Kambara | |
| 6,156,030 A | 12/2000 | Neev | |
| 6,207,926 B1 | 3/2001 | Xuan | |
| 6,246,543 B1 | 6/2001 | Baumgart et al. | |
| 6,291,794 B1 | 9/2001 | Dulaney | |
| 2001/0035401 A1 | 11/2001 | Manor | |
| 2002/0000426 A1 | 1/2002 | Mead et al. | |
| 2002/0170891 A1 | * 11/2002 | Boyle et al. | 219/121.67 |

FOREIGN PATENT DOCUMENTS

JP            03-057581       * 3/1991

* cited by examiner

Primary Examiner—Stefan Staicovici

(57) ABSTRACT

A method of controlling thermal loading of an electronic component material during ablation thereof provides a first laser light beam 42 at a certain power density and fluence and uses the first laser light beam to remove a portion of a first side 47 of the material 36. A second laser light beam 44 is provided at a certain power density and fluence and the second laser light beam is used to remove a portion of a side 49 of the material opposing the first side thereof substantially simultaneously as the portion of the first side is being removed.

14 Claims, 2 Drawing Sheets

METHOD OF LASER MACHINING MATERIALS WITH MINIMAL THERMAL LOADING

FIELD OF THE INVENTION

The invention relates to a laser system and, more particularly, to a method of using a laser system to control fluence and power density at a target to minimize thermal loading of the target.

BACKGROUND OF THE INVENTION

Machining of electronic component material using a laser is a function of the laser parameters and the machining characteristics of the specific material. The machining characteristics are substantially affected by the thermal properties of the material or of the material sets forming conductive layers and dielectric layers. Excess thermal loading of materials can cause quality and reliability problems with the final product.

Conventionally, the modulation of fluence and power density (peak power density) of a laser system to affect thermal loading is achieved by varying the power output of the laser, attenuating the power, varying the repetition rate of the laser, or changing the position of the workpiece in relation to the focal plane of the respective laser system. These methods have distinct disadvantages in controlling the fluence and or power density at the target or workpiece. For example, changing the repetition rate of the laser will cause instability and lead to a certain predetermined set of conditions. The entire range of desired fluence and power density settings cannot be scanned. In addition, the repetition rate cannot be used to create changes in less than one second intervals for a given laser source due to the resonator instability and first pulse phenomena. Thus, changing the repetition rate of the laser tends to introduce a large amount of variability in the fluence and power density.

Accordingly, there is a need to provide a method of minimizing thermal loading to surrounding areas while machining an electronic component material using a laser.

SUMMARY OF THE INVENTION

An object of the invention is to fulfill the need referred to above. In accordance with the principles of the present invention, this objective is achieved by providing a method of controlling thermal loading of an electronic component material during ablation thereof. The method provides a first laser light beam at a certain power density and fluence and uses the first laser light beam to remove a portion of a first side of the material. A second laser light beam is provided at a certain power density and fluence and the second laser light beam is used to remove a portion of a side of the material opposing the first side thereof substantially simultaneously as the portion of the first side is being removed.

In accordance with another aspect of the invention, a method of controlling thermal loading of an electronic component material during ablation thereof includes directing a laser light beam to remove material so as to create a heat affected zone in the material. The operator then waits a certain time period to permit the material to cool and to permit the heat affected zone to expand in the material. Thereafter, the laser light beam is directed to further remove material in at least a portion of the heat-affected zone.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION OF THE PREFERRED EMBODIMENT

Figure 1:
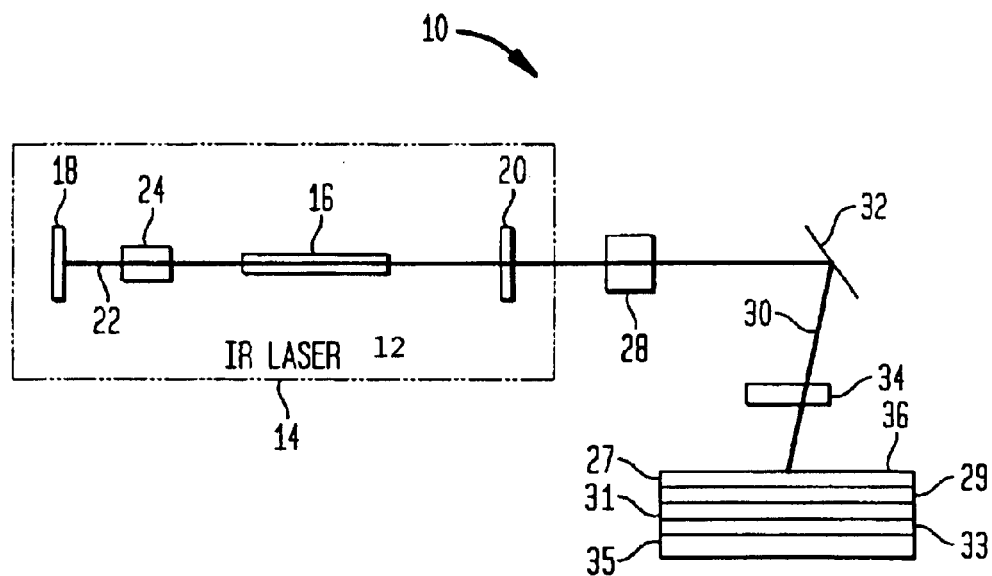
FIG. 1 is a schematic illustration of an embodiment of a laser system for use in a method of the present invention.

With reference to FIG. 1, a preferred embodiment of a laser system 10 is shown for use in the method of the present invention. The laser system 10 includes a IR laser 12 having a resonator cavity 14 which comprises a lasant 16 positioned between a highly reflective mirror 18 and a partially transmissive mirror (or output coupler) 20 along a beam path 22. The lasant 16 in the resonator cavity 14 is preferably a solid-state laser rod comprising Nd:YAG, Nd:YAP, Nd:YVO$_4$. However, those skilled in the art will recognize that other solid-state lasants or even gas, semiconductor or tunable organic dye lasants could be used in the lasers 12. For example, suitable gas lasants and their fundamental wavelengths could include Nitrogen (337.1 nm), HeCd (325.0–441.6 nm), Argon (457.9–514.5 nm), Krypton (350.7–799.3 nm), HeNe (632 nm), CO (4.0×10$^3$ –5.5×10$^3$ nm), CO$_2$ (10.6×10$^3$ nm), and H$_2$O (118.3×10$^3$ nm). As another example, suitable solid-state lasants could include Ruby (694.3 nm), Nd:Glass (1.06×10$^3$ nm), Nd:YAG (1.06× 10$^3$ nm), Nd:YAP (1.06×10$^3$ nm), and Nd:YVO$_4$, while suitable semiconductor lasants could include GaAs (904 nm for a single diode or 850±50 nm for an array of 48 diodes).

Laser rod 16 may be pumped by a variety of pumping sources (not shown) well known to persons skilled in the art, such as thermal, electrical or optical. However, a suitable diode pump or arc lamp is preferred for the illustrated Neodymium based laser system.

The resonator cavity 14 is illustrated with an associated Q-switch 24 which preferably operates by electro-optical or accusto-optical means. Other well known laser components (e.g., polarizers, limiting apertures, attenuators and the like) and their uses, positioning, and operation are well known to those skilled in the art and could be utilized inside the resonator cavities as desired.

The IR output from the resonator 14 is passed through an upcollimator structure 28, after which it is deflected downwardly along a beam path 30 by a beam-directing reflector 32 into a focusing lens 34 and then to an electronic component material. In the illustrated embodiment, the electronic component material is silicone or a multi-layered target 36.

Instead of employing an IR laser, any suitable laser can be employed such as a green laser to produce green light (e.g., between about 500 nm to about 580 nm), a UV laser (e.g., UV light at harmonics of 1064 nm fundamental wavelength) or a multiple wavelength laser (e.g., EM radiation at a fundamental wavelength of 1064 nm).

The multi-layered target 36 can be, for example, a circuit board with a top conductor layer 27, an upper dielectric layer 29, an embedded conductor layer 31, a lower dielectric layer 33, and a bottom conductor layer 35, respectively. The conductor layers may comprise conductive metals such as copper, aluminum, titanium, nickel, tungsten, platinum, gold, molybdenum, palladium, silver, or combinations thereof. The dielectric layers may comprise an organic composition such as PTFE, polyimides, epoxies, or combinations thereof. The dielectric materials may be reinforced with glass fibers, aramid fibers, KEVLAR, ceramics, or combinations thereof. In the preferred embodiment, the conductor layers are preferably copper and dielectric layers are either RCC or FR4, both of which contain epoxy, an organic dielectric material. FR4 also contains glass reinforcement. It should be apparent that these construction used in the PCB manufacturing are only examples of dielectric conductor layers used to form circuits. The example is only one of a multitude of constructions.

Figure 2:
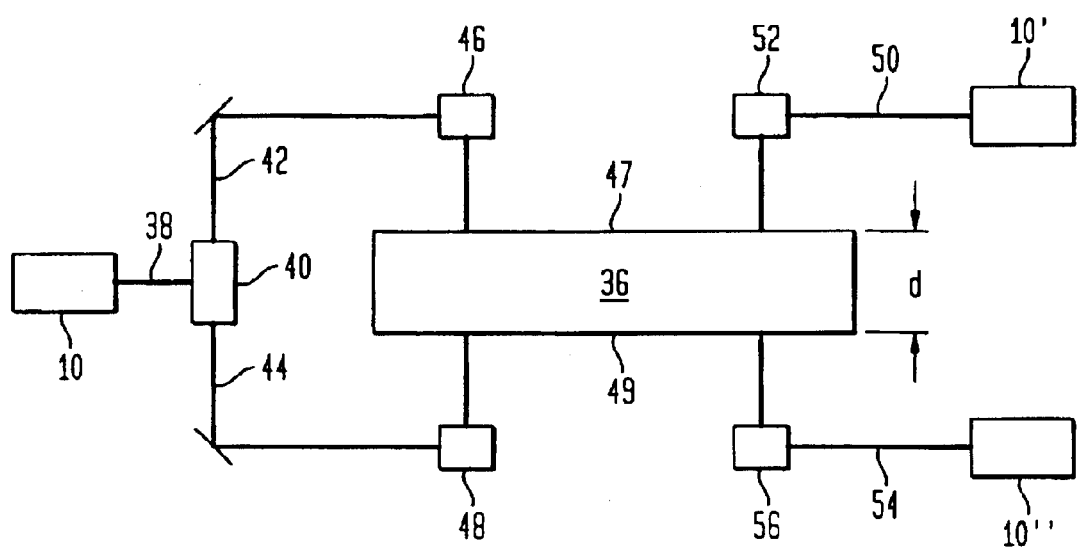
FIG. 2 is a schematic illustration of a method of machining material using laser systems of the type of FIG. 1.

The laser system 10 is preferably used to create vias, e.g., blind or through holes in the electronic component material or target 36, such as a circuit board. To control thermal loading of the target 36, machining of the target with a laser system 10 can occur from all or various degrees of freedom, e.g., top, bottom, and sides of the target 36. For example, with reference to the left-hand portion of FIG. 2, a laser system 10 produces a laser light beam 38 that is split by beam splitter 40 into an upper light beam 42 and a lower light beam 44. The upper light beam passes through an optical diffuser 46 and ablates the target 36 at an upper portion 47 thereof at a certain fluence and power density. The lower light beam 44 passes through another optical diffuser 48 and ablates a lower portion 49 of the target 36 at certain fluence and power density. The fluence and power density of the beams 42 and 44 can be the same or can be different from each other. As shown in FIG. 2, the light beams 42 and 44 ablate different areas of the target 36. It can be appreciated that the light beams 42 and 44 can be disposed along a common axis to cut a through hole in the target 36.

Instead of providing the single laser system 10 to ablate the target 36, with reference to the right-hand portion of FIG. 2, a first laser system 10' can be used to ablate from the upper surface of the target 36 and a second laser system 10" can be used to ablate from the lower portion of the target 36. More particularly, the first laser system 10' generates a light beam 50 that passes through an optical diffuser 52 to ablate from the top portion 47 of the target 36. The second laser system 10" generates a second laser light beam 54 that passes through another optical diffuser 56 to ablate from the lower portion 49 of the target 36. As shown, the light beams 50 and 54 are aligned axially to create a through hole in the target 36. The thickness d of the target of FIG. 2 is preferably greater than 200 Angstroms. The fluence and power densities of the beams 50 and 54 can be the same or can be different from each other. It can be appreciated that the beams 54 and 50 need not be aligned axially when different areas of the target are to be ablated.

Figure 3A:
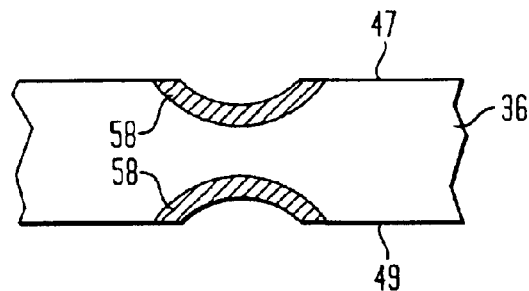
FIGS. 3A and 3B show heat affected zones as a result of ablating a target material from both sides thereof to create a through hole.
Figure 3B:
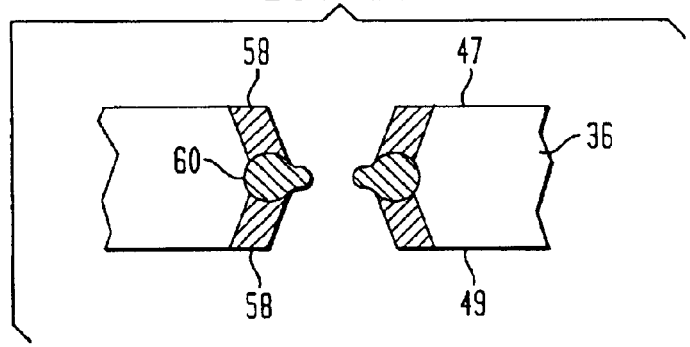

Hence, by machining or cutting from both sides of the target 36, thermal loading of the target 36 is minimized while increasing throughput rate. Furthermore, with reference to FIGS. 3A and 3B, a heat assist ablation zone aids in ablation and minimizes thermal loading when both sides of the target 36 are ablated to create a through hole. More particularly, FIG. 3A shows an initial ablation from both the top and bottom of the target 36. During ablation, material is removed and heat affected zones 58 are created at both the top and the bottom of the target 36. In addition, near the central portion of the target 36, as the heat affected zones merge, a heat assist ablation zone 60 is defined which allows for faster and more efficient laser ablation of the target 36 since ablation is then performed on material that is already heated.

Figure 4:
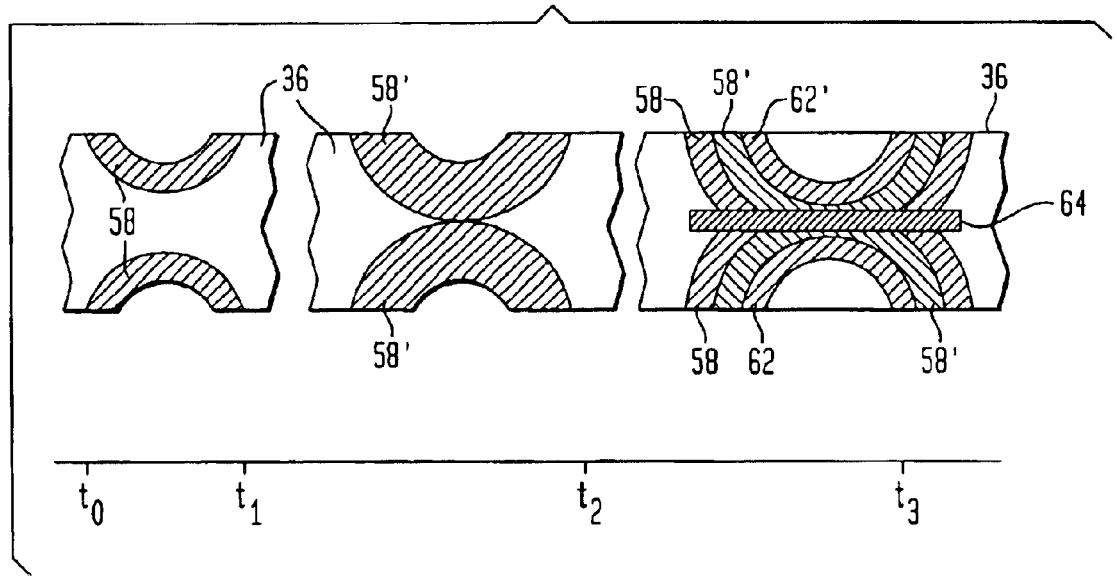
FIG. 4 show heat affected zones over periods of time as a result of ablating a target material from both sides thereof to create a through hole.

With reference to FIG. 4, in a temporal serial processing technique, an initial ablation, simultaneously from both sides of a target 36, at time $t_0$ results in material being removed and creation of initial heat affected zones 58 at time $t_1$. After a cooling period, (e.g., $t_1$ to $t_2$) the heat affected zones 58' in the target 36 material have diffused, covering a larger area. Another ablation is performed during time $t_2$ to $t_3$ at the top and bottom of the target 36 that results in the heat affected zone 62 along with heat assisted zone 64. Since the further ablation is performed in the heat affected zones and the heat assisted zone is created, this technique results in faster and more efficient material removal while minimizing thermal loading of the target 36.

In using the technique described above, it can be appreciated that instead of having the laser light beams axially aligned during ablation to create a through hole, the light beams ablating the target can be located at different areas as in the left hand portion of FIG. 1. Thus, in a spatial serial processing technique, a first area of the target 36 is initially ablated. Thereafter, a second area is initially ablated while the first area is cooling. Once the initial ablation of the second area is complete, the first area can be further ablated. This process is continued until all areas are fully ablated. As a result, thermal loading of the target 36 is minimized. In either the temporal or spatial serial processing techniques, a low degree of thermal loading is achieved by machining in distinct steps to allow the same amount of fluence to be transferred to the target 36.

The methods described above minimize thermal loading of the target 36 during machining of through holes or vias therein by working from the top of the target and from the bottom of the target generally simultaneously. Also, different areas of a target can be worked on at different times or time intervals to avoid threshold levels of thermal loading in the surrounding material of the target.

With the disclosed methods, the resulting structures (e.g., vias) are better in quality and allow for improved manufacturing of the devices. The improvement is based on the adjustment of the energy density during the formation of structures i.e., vias, to accomplish:

1. Lower thermal loading
2. Higher throughput rates (adjustment of Fluence/Density during machining process)
3. Improve the cut quality and shape of vias in electronic material, dicing of silicon and related areas
4. Improve the Depth of Field on laser systems.

The laser and methods disclosed herein are applicable to any laser process used to cut, weld, anneal or define shapes on electronic material. The specific electronic material of interest is silicone (used in integrated electronic circuits) and advanced electronic packages/PCBs composed of multiple layers of conductive and non-conductive layers. The method is applicable to any lasers incorporated into laser systems that use a certain power density and fluence at the workpiece.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. A method of controlling thermal loading of an electronic component material during ablation thereof, the method including:

prov018ing a first laser light beam at a certain power density and fluence and using the first laser light beam to remove a portion of a first side of the material, providing a second laser light beam at a certain power density and fluence and using the second laser light beam to remove a portion of a side of the material opposing the first side thereof substantially simultaneously as the portion of the first side is being removed, thereby controlling thermal loading of the material, permitting the first laser light beam to create a first heat affected zone in the workpiece and the second laser light beam to create a second heat affected zone in the workpiece, and permitting the heat affected zones to merge to define a heat assisted ablation zone, the method including ablating through the heat assisted ablation zone.

2. The method of claim 1, wherein the first laser light beam is aligned axially with the second laser light beam to create a through hole in the material.

3. The method of claim 1, wherein the first laser light beam is provided by a first laser system and the second laser light beam is provided by a second laser system.

4. The method of claim 1, wherein the material comprises conductive and non-conductive layers.

5. The method of claim 1, wherein the material has a thickness greater than 200 Angstroms.

6. The method of claim 1, wherein a laser system is provided generating a single laser light beam, the method includes splitting the single laser light beam to define the first laser light beam and the second laser light beam.

7. The method of claim 1, wherein the fluence and power densities of the first and second laser light beams are different from each other.

8. The method of claim 1, wherein the material is composed of silicon.

9. A method of controlling thermal loading of an electronic component material during ablation thereof, the method including:

directing, along an axis, a first laser light beam to remove a portion of one side of the material thereby creating a first heat affected zone in the material, and simultaneously directing along the axis, a second laser light beam to remove a portion of a side of the material opposing the one side thereof thereby creating a second heat affected zone in the material, waiting a certain time period to permit the material to cool and to permit the heat affected zones to expand in the material, and after the waiting step, directing the laser light beams to further remove material in at least a portion of the heat affected zones to create a through hole in the material, wherein the waiting step is long enough to permit the heat affected zones to merge in the material.

10. The method of claim 9, wherein the workpiece is composed of multiple conductive and non-conductive layers.

11. The method of claim 9, wherein the material is composed of silicon.

12. A method of controlling thermal loading of an electronic component material during ablation thereof, the method including:

directing a laser light beam to remove a first area of the material so as to create a first heat affected zone in the material, thereafter, directing a laser light beam to remove a second area of a material so as to create a second heat affected zone in the material, waiting a certain time period to permit the material to cool and to permit the heat affected zones to expand in the material, thereafter, directing the laser light beam to further remove material in the first heat affected zone, and thereafter, directing the laser light beam to further remove material in at least a portion of the second heat affected zone, wherein the waiting step is long enough to permit the heat affected zones to merge in the material.

13. The method of claim 12, wherein the, material is composed of multiple conductive and non-conductive layers.

14. The method of claim 12, wherein the material is composed of silicon.

* * * * *